United States Patent [19]

Ueda

[11] Patent Number: 4,948,756
[45] Date of Patent: Aug. 14, 1990

[54] METHOD OF MAKING INTERCONNECTS BETWEEN POLYSILICON LAYERS

[75] Inventor: Seiji Ueda, Ohtsu City, Japan

[73] Assignee: Matsushita Electronics Corporation, Kadoma, Japan

[21] Appl. No.: 265,355

[22] Filed: Oct. 28, 1988

Related U.S. Application Data

[60] Continuation of Ser. No. 908,382, Sep. 17, 1986, abandoned, which is a division of Ser. No. 506,373, Jun. 21, 1983, abandoned.

[30] Foreign Application Priority Data

Jun. 25, 1982 [JP] Japan .................. 57-110176

[51] Int. Cl.$^5$ .......................................... H01L 21/283
[52] U.S. Cl. .................................... 437/195; 437/193; 437/192; 437/49; 148/DIG. 20
[58] Field of Search ............... 437/192, 200, 193, 195, 437/41, 49; 148/DIG. 20; 357/71

[56] References Cited

U.S. PATENT DOCUMENTS

| | | | |
|---|---|---|---|
| 3,266,127 | 8/1966 | Harding et al. | 437/41 |
| 3,544,399 | 12/1970 | Dill | 437/41 |
| 3,750,268 | 8/1973 | Wang | 437/41 |
| 4,305,200 | 12/1981 | Fu et al. | 148/DIG. 147 |
| 4,317,274 | 3/1982 | Yasunari | 437/41 |
| 4,374,700 | 2/1983 | Scott et al. | 156/656 |
| 4,441,247 | 4/1984 | Gargini et al. | 437/192 |
| 4,458,410 | 7/1984 | Sugaki et al. | 437/200 |
| 4,528,744 | 7/1985 | Shibata | 437/41 |
| 4,619,037 | 10/1986 | Taguchi et al. | 437/200 |

FOREIGN PATENT DOCUMENTS 0022886 2/1980 Japan .
2082387 3/1982 United Kingdom .

Primary Examiner—Brian E. Hearn
Assistant Examiner—T. N. Quach
Attorney, Agent, or Firm—Cushman, Darby & Cushman

[57] ABSTRACT

Disclosed is a process for making a semiconductor device which has two polycrystalline layers (5) and (15) isolated by insulation films. Openings are made utilizing a single photoresist mask by etching the polycrystalline silicon layer and the underlying insulation film in one sequence. The polycrystalline silicon layers and diffused regions of the substrate exposed in the openings, are connected with a tungsten film (12) by selective deposition.

6 Claims, 5 Drawing Sheets

METHOD OF MAKING INTERCONNECTS BETWEEN POLYSILICON LAYERS

This is a continuation of application Ser. No. 06/908,382, filed Sept. 17, 1986, which was abandoned upon the filing hereof.

This is a division of application Ser. No. 506,373, filed June 21, 1983 now abandoned.

BACKGROUND OF THE INVENTION

1. Field of the Invention:

The present invention relates to a semiconductor device and a method of making the same. The present invention specially concerns a semiconductor device principally comprising MOSFET intended to achieve a higher integration and lower wiring resistance.

2. Description of the Prior Art:

In recent years, in order to achieve higher integration of ICS or LSI, miniaturization of unitary devices and decreasing of wiring resistances have actively been sought.

Generally, in MOS IC or MOS LSI, a polycrystalline silicon pattern, and an aluminum wiring pattern, a provided on a substrate with an insulation film therebetween together with combined diffused regions formed in the substrate, are widely used. However, as the unit devices become smaller, wiring between them and interconnection between the wirings become more difficult. Thus, the wiring and the unit devices are likely to be destroyed during the wiring process. This has been a shortcoming in the manufacturing of semiconductor ICS or LSI.

Firstly, an explanation is made with reference to FIG. 1(a) to FIG. 1(f), which show the prior art steps of manufacturing an N-channel silicon gate MOS LSI as an example embodying the prior art connections between a polycrystalline silicon layer and a diffused region.

Firstly, as shown in FIG. 1(a), on a principal surface of a P-type silicon substrate, isolation regions of a thick film of oxide of silicon are formed by a known selective oxidation method. Then, as shown in FIG. 1(b), gate-oxide film 3 shown in FIG. 1(b) is formed by, for instance, thermal oxidation. Nextly, as shown in FIG. 1(c), a photoresist film of a desired mask pattern for forming the gate-oxide film 3, is formed in order to make an opening 39 on the gate-oxide film 3. This step is carried out by chemical etching using a fluoric acid-fluoroammonium mixed solution. Then, after forming the opening 39 on the oxide film, the photoresist film 4 is removed by a known method, and as shown in FIG. 1(d), a polycrystalline silicon layer 5 is formed thereon. Thereafter, phosphorus is diffused on the polycrystalline layer 5 by a known thermal diffusion method, thereby to increase electric conductivity. Simultaneously, phosphorus is diffused in the substrate 1 to form a N+-diffused region 6, which is to be connected to the polycrystalline layer 5. Then, as shown in FIG. 1(e), the polycrystalline silicon layer 5 is etched to a predetermined pattern. Then as shown in FIG. 1(f), by utilizing this polycrystalline silicon layer 5 as a mask, N+-diffusion regions 7 which become source and drain are formed in the substrate 1 by ion-implanting phosphorus or arsenic by the known method, and an interlayer insulation film 8 is formed thereon. After forming electrode contact openings on the insulation films 8, 3, aluminum alloy electrodes 9 are formed therein, and then protection film 10 is formed thereon.

In case a semiconductor device would comprise double-layered polycrystalline silicon layers. Connections between the first polycrystalline silicon layer and the diffused region on the substrate and connection between the second polycrystalline silicon layer and the diffused region on the substrate and connection between the first polycrystalline layer and the second polycrystalline layer would be made in accordance with the preceding prior art example. Accordingly, in such a double-layered polycrystalline silicon structure, the steps of forming opening in the insulation film, become necessarily doubled in number.

As has been described, the prior art making of the MOS FET uses lithographic etching of the gate-oxide film. Therefore when the photoresist film has a pinhole or a similar defect, the gate-oxide film that is obtained will correspondingly have a pinhole or similar defect this pinhole in the the gate-oxide film resultantly, will shortcircuit the substrate and the polycrystalline silicon film. Furthermore, removing of the photoresist film after the etching is made by immersing the substrate into fuming nitric acid or a the like substance to be used for the resist removal or by applying. oxygen, plasma etching. Accordingly, the gate-oxide film is likely to be polluted with heavy metal or the like impurities in the etching agent or in the photoresist. Furthermore, the prior art method makes thin oxide film, of about 1 nm on the surface of the silicon substrate. Accordingly, there is a necessity to remove the thin oxide film by chemical etching by fluoric acid prior to formation of polycrystalline silicon layer on the substrate before the formation of polycrystalline silicon layer. And at this step the gate-oxide-film is also etched to some extent. Therefore, irregular parts may be formed on the surface of the gate-oxide film, and such influence is especially adverse when the gate-oxide film becomes thinner as the individual element of the IC or LSI becomes designed smaller.

Summary of the Invention

The present invention is made with a purpose to remove the above-mentioned shortcoming, and provide semiconductor device comprising wiring formed by polycrystalline silicon layers, diffused regions and their interconnections made by easier and reliable method without lowering reliability of connection, and also the method of making the same.

That is, the semiconductor device in accordance with the present invention comprises:
  a semiconductor substrate,
  at least an impurity-diffused region formed on a part of a principal face of the substrate,
  an insulation film formed on the substrate with an opening to expose the impurity diffused region therefrom,
  at least a polycrystalline semiconductor layer formed on the insulation film to surround the opening on the impurity diffused region, and
  a conductive film formed to connect the impurity diffused region and the polycrystalline semiconductor layer surrounding the opening.

Method for making the semiconductor device in accordance with the present invention comprises the steps of:
  forming an insulation film on a semiconductor substrate, forming a polycrystalline semiconductor layer on the insulation film, forming at least one complex opening by boring through the polycrystalline semiconductor layer and further the underlying insulation film,thereby exposing a surface of said substrate, introducing an impurity through the complex opening into the substrate to form an impurity-diffused region in the substrate, and selectively forming a conductive film on the impurity-diffused region and on the polycrystalline layer, to connect the impurity-diffused region and the polycrystalline film therewith.

Detailed Description of the Preferred Embodiments

A semiconductor device in accordance with the present invention and method of making the semiconductor device in accordance with the present invention are described in detail in the following, with reference to the accompanied of FIG. 2 and thereafter.

Figure 1A:
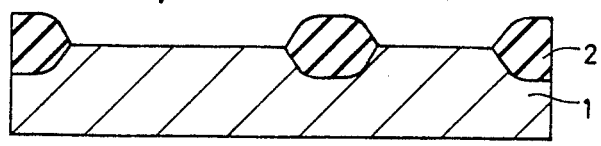
FIG. 1(a), FIG. 1(b), FIG. 1(c), FIG. 1(d), FIG. 1(e) and FIG. 1(f) are the sectional elevation views showing steps of manufacturing of the prior art MOS FET.
Figure 1B:
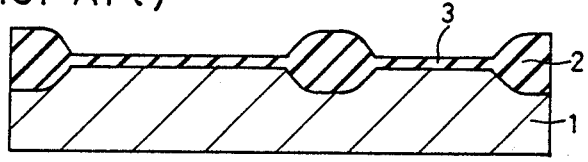
Figure 1C:
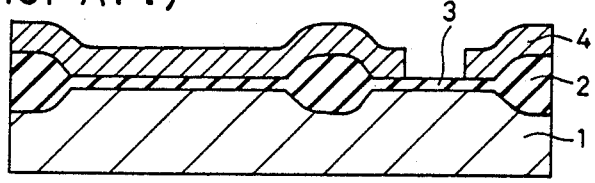
Figure 1D:
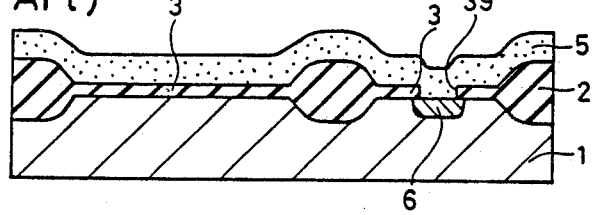
Figure 1E:
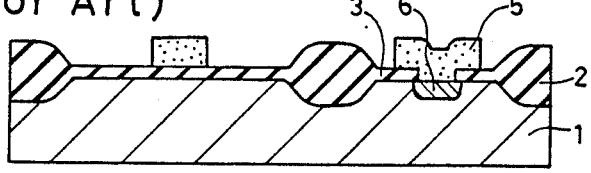
Figure 1F:
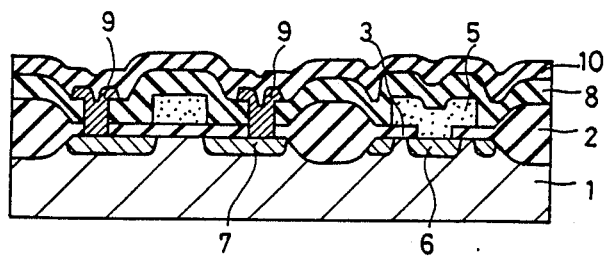
Figure 2:
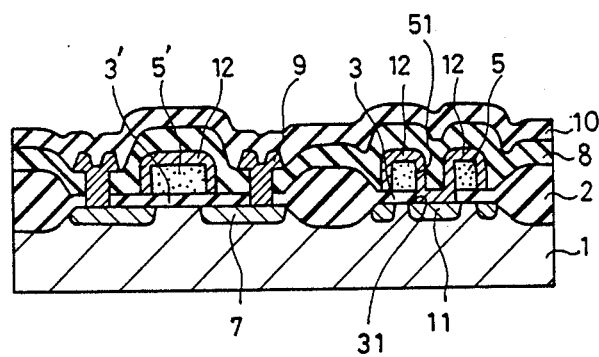
FIG. 2 is a sectional elevation view of a semiconductor device in accordance with the present invention.

FIG. 2 is a sectional elevation view of a semiconductor device of N-channel MOS FET made in accordance with the present invention. In this figure, the parts corresponding to the device shown in FIG. 1 are designated with the same numerals as those of FIG. 1.

The semiconductor device embodying the present invention comprises on a semiconductor substrate 1 of a first conductivity type, at least an impurity-diffused region 11 e.g. of a second conductivity type such as opposite to said first conductivity type, at least a polycrystalline semiconductor layer 5 formed on an insulation film 3 on the substrate 1 to surround said impurity-diffused region 11, and a conductive film 12, such as tungsten film formed by chemical vapor deposition (hereinafter referred to CVD), formed to connect said impurity-diffused region 11 exposed from an opening 31 formed through the insulation film 3 and said polycrystalline semiconductor layer 5 in the above-mentioned configuration. The diffused region 11 is formed by a known thermal diffusion method through opening 51, formed on the polycrystalline silicon layer 5, which is formed on the insulation film 3, such as silicon dioxide film formed simultaneously with the forming of the gate oxide film. Therefore, the diffused region 11 is formed in a self-alignment relation with the opening 51 of the polycrystalline silicon layer 5. The other part of the polycrystalline silicon layer 5, which is formed on, for instance, a part to become a gate oxide film 3' of the insulation film serves as a gate electrode 5' and is connected with the previously said polycrystalline silicon layer 5 around and above the diffused region 11. Thus, the diffused region 11 and the polycrystalline silicon layer 5 are connected by the CVD-formed conductive film 12 and also connected to the gate electrode 5' by the polycrystalline silicon layer inbetween.

This semiconductor device can be made without undesirable direct chemical etching of gate oxide film through a photoresist mask. Accordingly, the quality of the gate oxide film is not lowered by the direct chemical etching. Since tungsten film 12 is about 200 nm/and has such a low sheet resistance of about 1 $\Omega/\square$, the conductivity between the diffused region 11 and the polycrystalline silicon layer 5 is sufficiently low, thereby providing a satisfactory IC performance.

FIG. 3(a), FIG. 3(b), FIG. 3(c), FIG. 3(d), FIG. 3(e) and FIG. 3(f) show manufacturing steps of the semiconductor device of FIG. 2.

As shown in FIG. 3(a), at first thick oxide film 2 is selectively formed on a principal face of a p-type silicon substrate by means of selective oxidation method so as to form isolation regions between unit devices on the IC. Then, as shown in FIG. 3(b), gate oxide film 3 is formed on the substrate surface by a known method, and thereon a polycrystalline silicon layer 5 is formed to a thickness of 5000. Nextly, as shown in FIG. 3(c), by means of a known photolithographic method utilizing a photoresist film as a mask, a complex opening 31, 51 is formed on the polycrystalline silicon layer 5 and the underlying silicon dioxide film 3. After making the complex opening 31, 51, As used as an impurity is introduced by known method on the polycrystalline silicon layer 5 and on the surface part of the substrate 1 exposed from the complex opening 31, 51 to become N+-type impurity diffused region 11. Then, as shown in FIG. 3(d), by means of known photolithographic method, the polycrystalline silicon layer 5 is etched to a predetermined pattern as shown in FIG. 3(d). That is, the polycrystalline silicon layer 5 is retained in a ring shape on the insulation film 3 which is on the substrate 1 and around the diffused region 11, and also the polycrystalline silicon layer 5' is retained on the oxide film 3' which is to become a gate oxide film. Then, by means of a known ion-implantation method, P or As as impurity is implanted into the regions 7, 7' to become the source and drain regions in the substrate 1 through the silicon dioxide film 3, by utilizing the polycrystalline silicon layer 5 as mask as shown in FIG. 3(d). Then, the substrate is subject to annealing in an inert gas atmosphere such as nitrogen gas at about 900° C. Next, as shown in FIG. 3(e), under a low pressure atmosphere about 5 mm Torr at about 630° C., a tungsten film 12 is formed by means of known low pressure vapor deposition method utilizing tungstenhexafluoride and hydrogen gas. In this low pressure vapor deposition process, the tungsten film 12 is not formed on silicon dioxide film, and grows only on the surfaces of polycrystalline silicon layer 5 and exposed surface of the silicon substrate 1. Therefore, as shown in FIG. 3(e), the polycrystalline silicon layer 5 and the diffused region 11 are connected by the tungsten film formed in self-alignment way. Then, as shown in FIG. 3(f), a silicon nitride film 8 as interlayer insulation film is formed by known plasma growth method. Nextly, openings for electrode connection are formed and electrodes 9 are formed by means of known aluminum alloy, and thereon a known passivation film 10 is formed by known method.

Example 2

FIG. 4(a), FIG. 4(b), FIG. 4(c), FIG. 4(d), FIG. 4(e), FIG. 4(f) and FIG. 4(g) show manufacturing steps of a second example semiconductor device, wherein double layers of polycrystalline regions are comprised.

Figure 3:
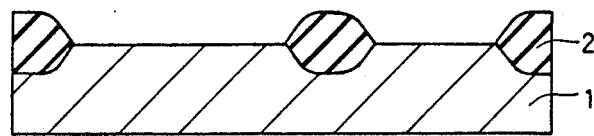
FIG. 3(a), FIG. 3(b), FIG. 3(c), FIG. 3(d), FIG. 3(e) and FIG. 3(f) are sectional elevation views showing manufacturing steps of an embodiment in accordance with the present invention.
Figure 3:
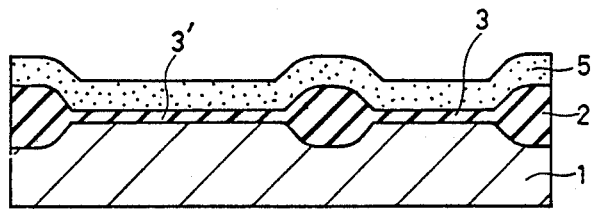
Figure 3:
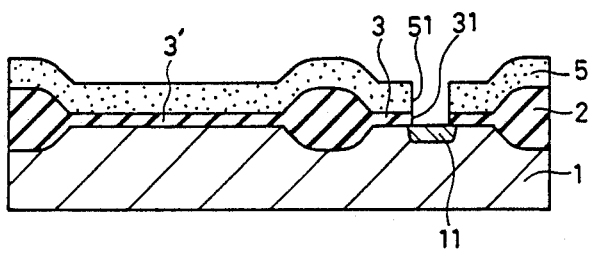
Figure 3:
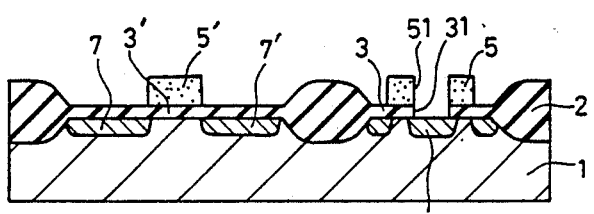
Figure 3:
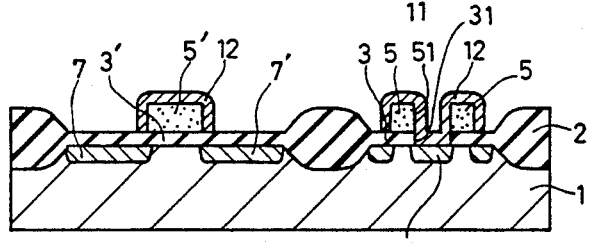
Figure 3:
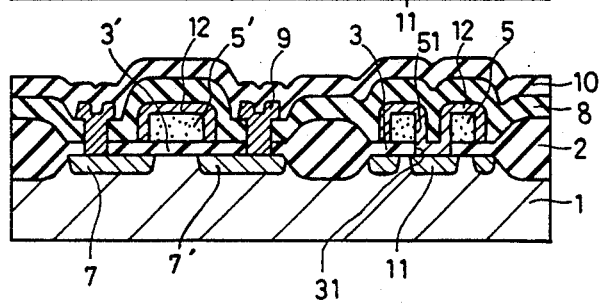

In the device of FIG. 4(a) to FIG. 4(g), the parts corresponding to those of FIG. 1, FIG. 2 and FIG. 3 are shown by the corresponding numerals.

Figure 4A:
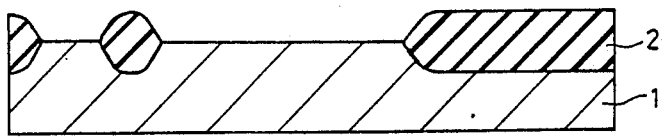
FIG. 4(a), FIG. 4(b), FIG. 4(c), FIG. 4(d),.
Figure 4B:
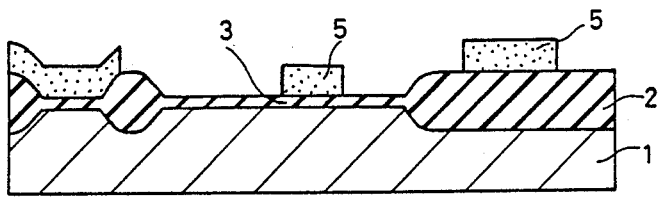
Figure 4C:
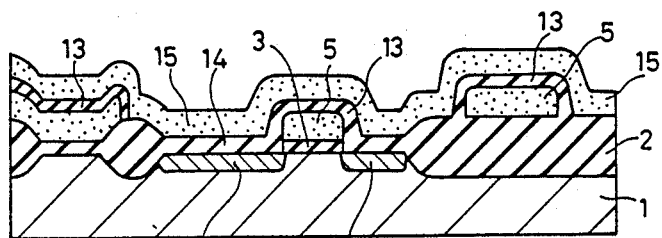

As shown in FIG. 4(a), by means of selective oxidation method a thick oxide film 2 is formed on a principal face of a substrate 1 to serve as isolation regions. Nextly, as shown in FIG. 4(b), gate oxide film 3 is formed by known method on the principal face of the substrate 1, and thereon a polycrystalline silicon layer 5 is formed with specified pattern produced by known photolithographic method. Further, as shown in FIG. 4(c), by forming the diffused regions 7 and 7' for source and drain regions by ion-implantation of P or As utilizing the polycrystalline silicon layer 5 as mask, followed by thermal treatment. Then by oxidizing the surface of the polycrystalline silicon layer 5, inter-layer insulation film 13 is formed, and simultaneously, the oxide films 14 on the diffused regions 7 and 7' are formed. And thereon, a second polycrystalline silicon layer 15 is formed.

Figure 4D:
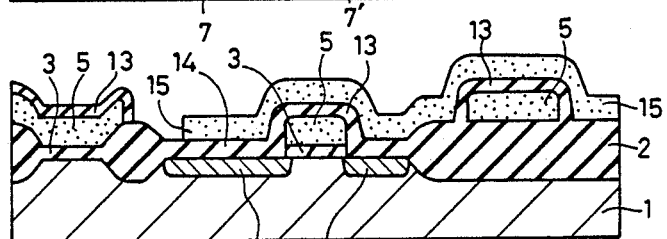
Figure 4E:
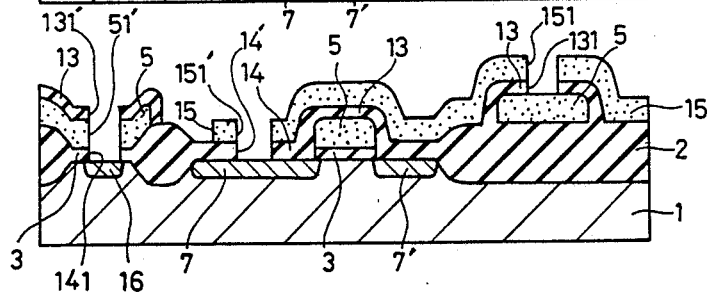
FIG. 4(e), FIG. 4(f) and FIG. 4(g) are sectional elevation views showing manufacturing steps of another example in accordance with the present invention.
Figure 4F:
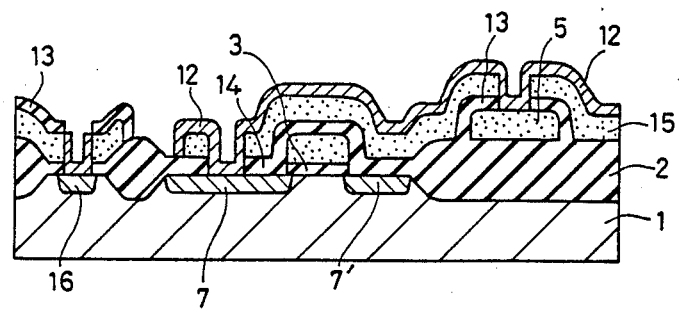
Figure 4G:
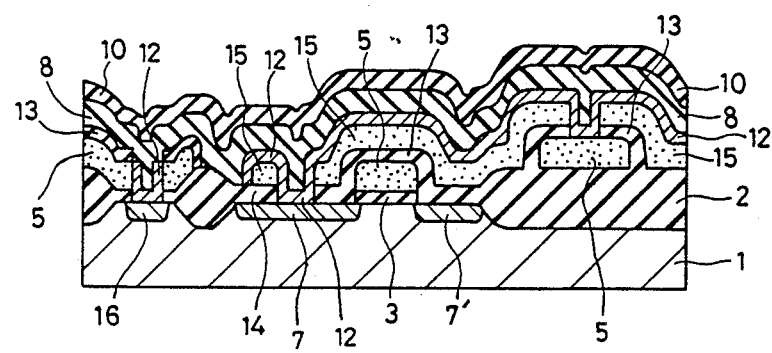

Thereafter, as shown in FIG. 4(d), by means of known photolithographic method, the second polycrystalline silicon layer 15 is etched to form a predetermined pattern. Then as shown in FIG. 4(e), a first complex opening 151, 131 at the rightest part of FIG. 4(e) is formed to expose the first polycrystalline silicon buried layer 5; also, a second complex opening 131', 51', 141 to expose the diffused region 16 on the leftest part of FIG. 4(e), and a third complex opening 151' 14' to expose the diffused regions 7 at the central part of FIG. 4(e) are formed by known photolithographic method. These etchings to form complex openings are formed by using one pnotoresist mask having three openings for the first complex opening, the second complex opening and the third complex opening. And the etchings for forming three complex openings are made substantially at the same time. That is, firstly the interlayer insulation film 13 is etched to form the opening and thereafter the polycrystalline silicon layers 15 and 5 are etched, and thereafter, the interlayer insulation film 13 or 3 is etched. Then, P or As as impurity is introduced on the first polycrystalline silicon layer 5 and exposed regions 16 to make them N+-type conductivity wiring and N+-type diffused region 16. Thereafter, as shown in FIG. 4(f), tungsten electrodes 12 are deposited by a low-pressure chemical vapor deposition selectively on the surfaces of the second polycrystalline silicon layer 15 and in three complex openings. Then, after forming an interlayer insulation film 8 by known plasma growth method followed by forming of known Al-alloy electrodes (not shown) to contact the diffused region 16 and the tungsten film 12 on the polycrystalline film 15, 5 as wirings in the part not shown in FIG. 4(g), the semiconductor device is completed.

The semiconductor device in accordance with the present invention elucidated in the above-mentioned examples can be manufactured by utilizing a single mask for boring the openings for connection between the polycrystalline silicon layers or between the polycrystalline silicon layer and impurity diffused regions, in contradistinction to the problematic conventional method which utilizes two separate photoresist masks.

Besides the above-mentioned tungsten electrodes to connect the polycrystalline silicon layer and the diffused regions, any other conductive substance which has a selective deposition characteristic with respect to the silicon is usable. Further, other substances which does not have the selective deposition characteristic on silicon surface may be used with a suitable preparatory treatment.

The semiconductor device in accordance with the present invention, especially of MOS device, has a superior stability and high production yield as a result of elimination of direct chemical etching of the gate oxide film, since such etching is made indirectly with the polycrystalline silicon layer formed over it, preventing pollution and generation of pin-holes of the gate oxide film.

What is claimed is:

1. A method for making a semiconductor device comprising the steps of:
    forming a first insulation film on a semiconductor substrate;
    forming a first polycrystalline semiconductor layer on selected parts of said first insulation film so that said first insulation film is underlying said first polycrystalline semiconductor layer;
    forming a second insulation film on said first polycrystalline semiconductor layer so that said first polycrystalline semiconductor layer is underlying said second insulation film;
    forming a second polycrystalline semiconductor layer on a selected part of said second insulation film;
    forming at least two openings, a first opening penetrating said first insulation film, said first polycrystalline semiconductor layer and said second insulation film thereby exposing side walls of said first insulation film, said first polycrystalline semiconductor layer and said second insulation film and exposing a surface of said substrate and, a second opening penetrating said second insulation film and said second polycrystalline semiconductor layer thereby exposing side walls of said second insulation film and said second polycrystalline semiconductor layer and exposing a surface of said first polycrystalline semiconductor layer;
    introducing an impurity through said first opening into said substrate to form an impurity-diffused region in said substrate; and
    selectively forming at least two conductive films, a first conductive film being formed in said first opening, and only on said impurity-diffused region, and said side walls of said first insulation film and said first polycrystalline semiconductor layer to connect together said impurity-diffused region, said first polycrystalline semiconductor layer and said first conductive film in self-alignment and, a second conductive film being formed in said second opening and on said surface of said first polycrystalline semiconductor layer, said side walls of said second insulation film and said second polycrystalline semiconductor layer to connect together said first polycrystalline semiconductor layer, said second polycrystalline semiconductor layer, and said second conductive film in self-alignment.

2. A method in accordance with claim 1, wherein said first polycrystalline semiconductor layer and said second polycrystalline semiconductor layer are polycrystalline silicon layers.

3. A method in accordance with claim 1, wherein said first polycrystalline semiconductor layer and said second polycrystalline semiconductor layer are polycrystalline silicon layers, and said conductive film is a tungsten film.

4. A method for making a semiconductor device comprising the steps of:
   forming a first insulation film on a semiconductor substrate;
   forming a first polycrystalline semiconductor layer on selected parts of said first insulation film, so that said first insulation film is underlying said first polycrystalline semiconductor layer;
   forming a second insulation film on said first polycrystalline semiconductor layer so that said first polycrystalline semiconductor layer is underlying said second insulation film;
   forming a second polycrystalline semiconductor layer on a selected part of said second insulation film;
   forming at least two openings, a first opening penetrating said first insulation film, said first polycrystalline semiconductor layer and said second insulation film, thereby exposing side walls of said first insulation film, said first polycrystalline semiconductor layer and said second insulation film and a first surface of said substrate and, a second opening penetrating said second insulation film, and said second polycrystalline semiconductor layer thereby exposing side walls of said second insulation film and said second polycrystalline semiconductor layer and exposing a second surface of said substrate;
   introducing an impurity through said first opening into said first region of said substrate to form an impurity-diffused region in said first region of said substrate; and
   selectively forming at least two conductive film, a first conductive film being formed in said first opening only on said impurity-diffused region, and said side walls of said first insulation film and said first polycrystalline semiconductor layer to connect together said impurity-diffused region, said first polycrystalline semiconductor layer and said first conductive film in self-alignment and, a second conductive film being formed in said second opening on said second surface of said substrate, said side walls of said second insulation film and said second polycrystalline semiconductor layer to connect together said substrate, said second polycrystalline semiconductor layer and said second conductive film in self-alignment.

5. A method in accordance with claim 4, wherein
   said first polycrystalline semiconductor layer and said second polycrystalline semiconductor layer are polycrystalline silicon layers.

6. A method in accordance with claim 4, wherein
   said first polycrystalline semiconductor layer and said second polycrystalline semiconductor layer are polycrystalline silicon layers, and
   said conductive film is a tungsten film.

* * * * *